(12) United States Patent
Chung et al.

(10) Patent No.: US 11,991,882 B2
(45) Date of Patent: May 21, 2024

(54) METHOD FOR FABRICATING MEMORY DEVICE

(71) Applicant: MACRONIX International Co., Ltd., Hsinchu (TW)

(72) Inventors: Yao-An Chung, Hsin-chu (TW); Yuan-Chieh Chiu, Hsinchu County (TW); Ting-Feng Liao, Hsin-chu (TW); Kuang-Wen Liu, Hsin-chu (TW); Kuang-Chao Chen, Hsin-chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 213 days.

(21) Appl. No.: 17/528,068

(22) Filed: Nov. 16, 2021

(65) Prior Publication Data

US 2022/0077187 A1    Mar. 10, 2022

Related U.S. Application Data

(62) Division of application No. 16/728,394, filed on Dec. 27, 2019, now Pat. No. 11,211,401.

(51) Int. Cl.
| | |
|---|---|
| *H10B 43/27* | (2023.01) |
| *H01L 21/02* | (2006.01) |
| *H01L 21/28* | (2006.01) |
| *H01L 21/311* | (2006.01) |
| *H01L 21/768* | (2006.01) |
| *H01L 23/48* | (2006.01) |
| *H01L 29/51* | (2006.01) |

(52) U.S. Cl.
CPC ....... *H10B 43/27* (2023.02); *H01L 21/02532* (2013.01); *H01L 21/02636* (2013.01); *H01L 21/31111* (2013.01); *H01L 21/76802* (2013.01); *H01L 21/76831* (2013.01); *H01L 21/76877* (2013.01); *H01L 23/481* (2013.01); *H01L 29/40117* (2019.08); *H01L 29/513* (2013.01); *H01L 29/518* (2013.01)

(58) Field of Classification Search
CPC ..... H01L 2924/00014; H01L 27/11582; H01L 27/11556; H01L 2924/013; H01L 27/1157; H10B 43/27; H10B 43/10; H10B 41/27; H10B 43/40; H10B 43/50
See application file for complete search history.

(56) References Cited

U.S. PATENT DOCUMENTS

2020/0105595 A1*  4/2020  Sharangpani ....... H01L 23/5226

* cited by examiner

*Primary Examiner* — Tony Tran
(74) *Attorney, Agent, or Firm* — J.C. PATENTS (57) ABSTRACT

A method for fabricating a memory device includes: providing a substrate; forming a first dielectric layer over the substrate; forming a plurality of conductive layers and a plurality of dielectric layers alternately and horizontally disposed on the substrate; forming a channel column structure on the substrate and in the plurality of conductive layers and the plurality of dielectric layers, where a side wall of the channel column structure is in contact with the plurality of conductive layers; forming a second dielectric layer covering the first dielectric layer; and forming, in the first and second dielectric layers, a conductive column structure adjacent to the channel column structure and in contact with one of the plurality of conductive layers, where the conductive column structure includes a liner insulating layer as a shell layer.

9 Claims, 7 Drawing Sheets

METHOD FOR FABRICATING MEMORY DEVICE

CROSS-REFERENCE TO RELATED APPLICATION

This application is a divisional application of and claims the priority benefit of U.S. patent application Ser. No. 16/728,394, filed on Dec. 27, 2019, now allowed. The entirety of the above-mentioned patent application is hereby incorporated by reference herein and made a part of this specification.

BACKGROUND OF THE INVENTION

1. Field of the Invention

The invention relates to semiconductor fabrication, and in particular, to a method for fabricating a memory device.

2. Description of Related Art

A memory device is an essential component in a digital electronic apparatus. When a processing function of an electronic apparatus is greatly improved, a memory capacity of a memory device thereof also needs to be increased, and a size of the memory device also still needs to be reduced.

A three-dimensional NAND memory has been proposed as required, which is a flash memory changing from a two-dimensional NAND memory to a three-dimensional structure. A channel layer thereof is changed to be a vertical channel structure perpendicular to a substrate to become a channel column structure. A plurality of word line layers is laminated in a direction perpendicular to the substrate to form a string of transistors. An end of the word line layer is a staircase-like structure, and a word line is connected upward to an external control circuit through a conductive column structure. In this way, in a three-dimensional structure, a transistor may be fabricated in a vertical direction, so that a memory capacity may be increased.

However, due to a limited device area, a lateral two-dimensional area still needs to be greatly reduced. A large number of conductive column structures and channel column structures need to be configured in a high density, and a distance between column structures needs to be reduced. Since the conductive column structure supports much more word line layers, the conductive column structure and the channel column structure also need to have an increased length to be connected to the upper control circuit.

Under this demand, how to configure the conductive column structure and the channel column structure needs to be considered.

SUMMARY OF THE INVENTION

According to a memory device of the invention, a structure of a conductive column structure is proposed for fabrication of a conductive column structure and a channel column structure, and when a distance between the conductive column structure and the channel column structure is reduced and lengths of the conductive column structure and the channel column structure are greatly increased, electric leakage or even a short circuit occurring on the conductive column structure and the channel column structure at an end may be effectively reduced.

In an embodiment, the invention provides a method for fabricating a memory device, including: providing a substrate; forming a first dielectric layer over the substrate; forming a plurality of conductive layers and a plurality of dielectric layers alternately and horizontally disposed on the substrate; forming a channel column structure on the substrate and in the plurality of conductive layers and the plurality of dielectric layers, where a side wall of the channel column structure is in contact with the plurality of conductive layers; forming a second dielectric layer covering the first dielectric layer; and forming, in the first and second dielectric layers, a conductive column structure adjacent to the channel column structure and in contact with one of the plurality of conductive layers, where the conductive column structure includes a liner insulating layer as a shell layer.

In an embodiment, for the method for fabricating the memory device, the step of forming the channel column structure includes: forming, in the first dielectric layer, a columnar recess passing through the plurality of conductive layers; forming, on a side wall of the columnar recess, a charge storage layer in contact with the plurality of conductive layers; and forming, on the charge storage layer, a silicon column to be filled in the columnar recess, where the silicon column provides a channel area at each of the conductive layers correspondingly.

In an embodiment, for the method for fabricating the memory device, the charge storage layer is an oxide/nitride/oxide-laminated structure.

In an embodiment, for the method for fabricating the memory device, the step of forming the conductive column structure includes: forming, in the first and second dielectric layers, a columnar recess extending to predetermined one of the plurality of conductive layers; forming the liner insulating layer on a side wall of the columnar recess; and filling the columnar recess with a conductive material to form a conductive central column in contact with predetermined one of the plurality of conductive layers. The liner insulating layer covers the conductive material and also isolates the conductive material from the channel column structure.

In an embodiment, for the method for fabricating the memory device, the conductive material includes tungsten, copper, cobalt, silicon, or polysilicon.

In an embodiment, for the method for fabricating the memory device, the liner insulating layer is made of a material including silicon oxide, a high-density plasma (HDP) dielectric, tetraethoxysilane (TEOS), thermal oxide, or a high dielectric constant dielectric.

In an embodiment, for the method for fabricating the memory device, an upper end of the liner insulating layer includes a skewed-face structure generated after the liner insulating layer is etched back.

In an embodiment, for the method for fabricating the memory device, a bottom face of the conductive central column includes a portion that protrudes in a lateral direction and that occupies a removed space generated through surface cleaning before the conductive material is filled.

In an embodiment, for the method for fabricating the memory device, the conductive column structure is higher than the channel column structure.

In an embodiment, for the method for fabricating the memory device, a length of the conductive column structure is greater than or equal to three microns.

To make the features and advantages of the invention clear and easy to understand, the following gives a detailed description of embodiments with reference to accompanying drawings.

DESCRIPTION OF THE EMBODIMENTS

The invention proposes a memory device with changed conductive column structure and channel column structures, so that an isolation effect between a conductive column structure and a channel column structure can be enhanced. In this way, when a distance between the conductive column structure and the channel column structure is required to be reduced and lengths of the conductive column structure and the channel column structure are greatly increased, electric leakage or even a short circuit occurring on the conductive column structure and the channel column structure at an end may be effectively reduced.

Several embodiments are illustrated below to describe the invention, but the invention is not limited to the illustrated embodiments. In addition, appropriate combinations are allowed between the embodiments.

Figure 1:
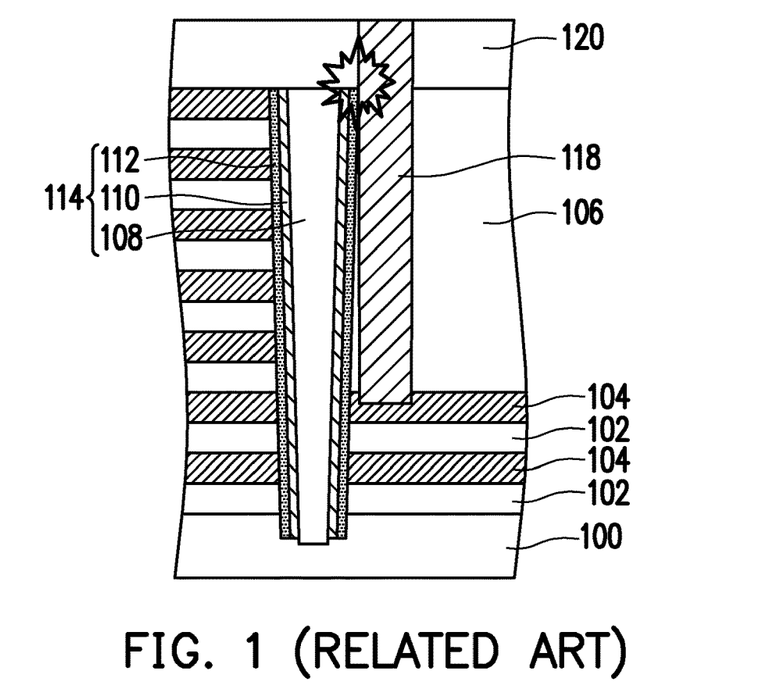
FIG. 1 is a schematic diagram of a defect between a conductive column structure and a channel column structure according to the invention.

The invention looks into a structure of a three-dimensional NAND memory device. FIG. 1 is a schematic diagram of a defect between a conductive column structure and a channel column structure according to the invention.

Referring to FIG. 1, a string of transistors of a three-dimensional NAND memory device are disposed along a channel column structure 114 perpendicular to a substrate 100. The channel column structure 114 includes an intermediate silicon column 110 and a charge storage layer 112 that covers the silicon column 110. The silicon column 110 is, for example, a hollow polysilicon column. According to a fabricating method, a central column 108 is formed through subsequent filling of an oxide layer. Alternatively, a solid silicon column 110 may be formed after being completely filled with polysilicon. A particular structure of the channel column structure 114 does not need to be limited in the invention. The silicon column 110 provides a channel layer required for a transistor. The charge storage layer 112 is, for example, a structure of oxide/nitride/oxide (ONO). A plurality of conductive layers 104 is also controlled as word lines on corresponding gates of a transistor on the channel column structure 114. At least an equal number of conductive layers 104 are disposed according to a number of transistors of the NAND. The conductive layers 104 are isolated from each other and supported by a dielectric layer 102. As such, a plurality of dielectric layers 102 and a plurality of conductive layers 104 are alternately laminated on the substrate 100. That there are two conductive layers 104 is used as an example herein. However, a number is actually determined according to a number of transistors, for example, is 32, 64, or other numbers. Therefore, the channel column structure 114 has a quite large length.

In addition, a conductive column structure 118 is also formed in the dielectric layers 106 and 120 to be adjacent to the channel column structure 114. The conductive column structure 118 is in contact with predetermined one of these conductive layers 104 to provide a voltage required for the word lines.

In the invention, it is found that after densification of the device, a distance between the conductive column structure 118 and the channel column structure 114 is reduced, but lengths of the conductive column structure 118 and the channel column structure 114 are also quite large as a result of a large number. As a result, ends of the conductive column structure 118 and the channel column structure 114 are close to each other. Therefore, electric leakage or even direct contact may be caused, resulting in failure of the memory string.

Through study of the conductive column structure 118 and the channel column structure 114, the invention proposes that at least an effect of isolation between the conductive column structure 118 and the channel column structure 114 may be enhanced.

Figure 2:
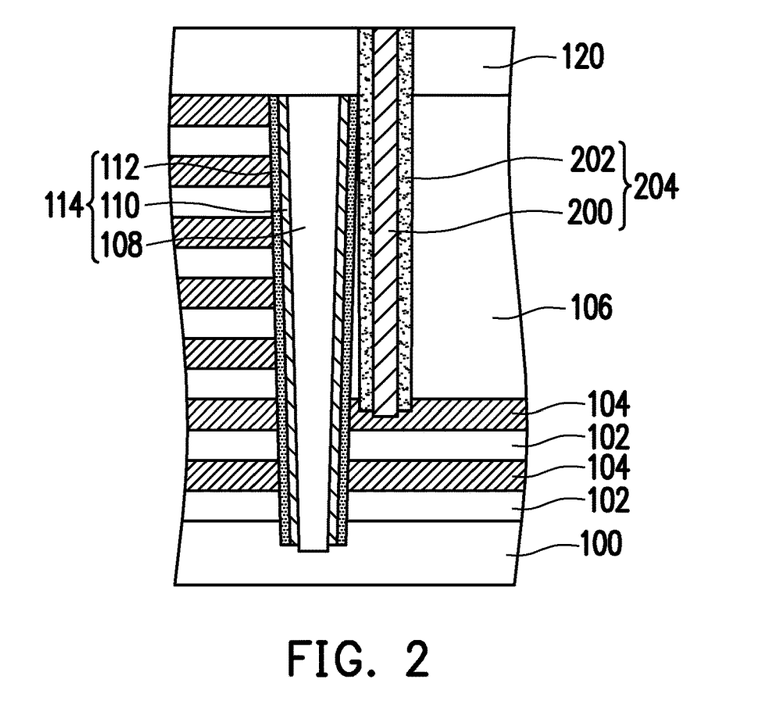
FIG. 2 is a schematic diagram of cross-sectional structures of a conductive column structure and a channel column structure of a memory device according to an embodiment of the invention.

FIG. 2 is a schematic diagram of cross-sectional structures of a conductive column structure and a channel column structure of a memory device according to an embodiment of the invention. Referring to FIG. 2, the memory device includes a substrate 100. A first dielectric layer 106 is disposed over the substrate 100. A plurality of conductive layers 104 and a plurality of dielectric layer 102 are alternately and horizontally disposed on the substrate 100. In an embodiment, the conductive layer 104 may also be made of tungsten or other electrical conductors such as tungsten, copper, cobalt, silicon, or polysilicon.

A channel column structure 114 is on the substrate 100 and in the conductive layers 104 and the dielectric layer 102. A side wall of the channel column structure 114 is in contact with the plurality of conductive layers 104. A second dielectric layer 120 covers the first dielectric layer 106. A conductive column structure 204 is in the first dielectric layer 106 and the second dielectric layer 120, and is adjacent to the channel column structure 114 and in contact with predetermined one of the plurality of conductive layers 104. The conductive column structure 204 includes a liner insulating layer 202 as a shell layer. A center of the conductive column structure 204 is a conductive central column 200.

A structure of the channel column structure 114 is, for example, the structure described in FIG. 1. It should be noted that the conductive column structure 204 includes a conductive central column 200 perpendicular to the substrate 100 and in contact with predetermined one of the plurality of conductive layers 104. The liner insulating layer 202 covers the conductive central column 200 and is in contact with the dielectric layer 106 to assist in isolating the conductive central column 200 from the channel column structure 114. The conductive central column 200 is made of a material including tungsten, copper, cobalt, silicon, or polysilicon. The liner insulating layer 202 is made silicon oxide, a high-density plasma (HDP) dielectric, tetraethoxysilane (TEOS), thermal oxide, or a high dielectric constant dielectric.

Since the shell layer of the conductive column structure 204 is the liner insulating layer 202 that provides a further isolation effect, the effect of isolation from the channel column structure 114 may be enhanced without substantially changing an intensity of the conductive column structure 204.

A plurality of embodiments of a fabricating process is described below. FIG. 3A to FIG. 3D are schematic flowcharts of fabricating a conductive column structure and a channel column structure of a memory device according to an embodiment of the invention.

Figure 3A:
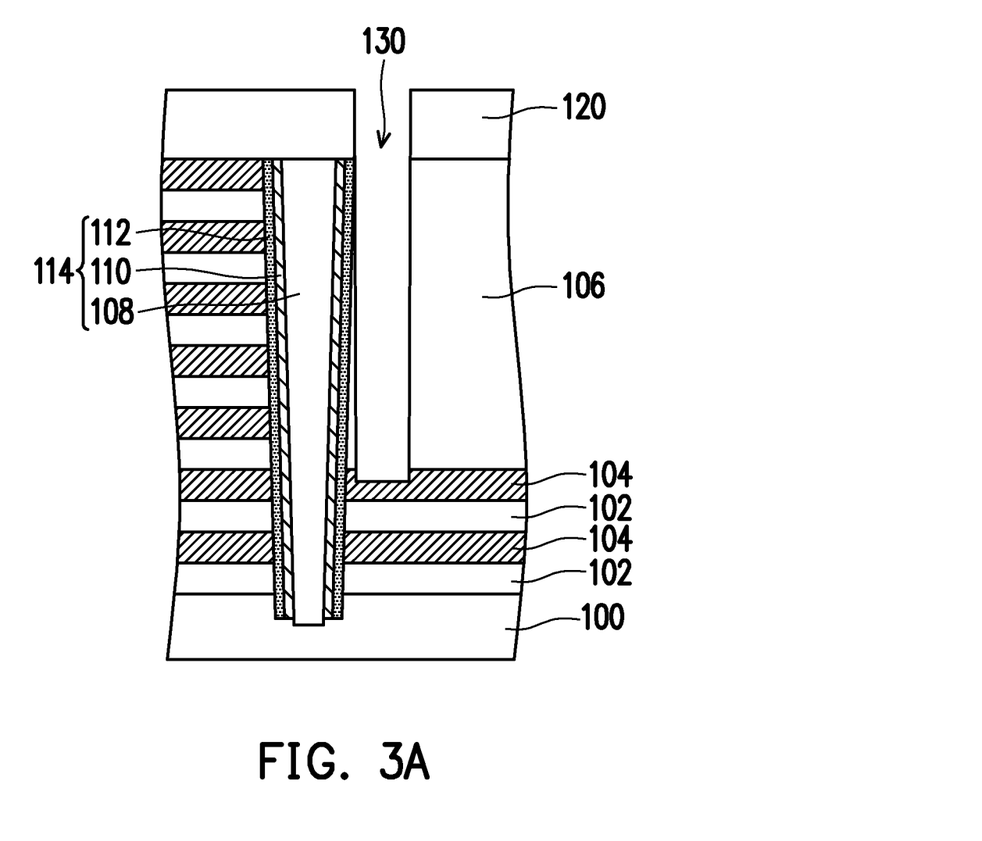
FIG. 3A to FIG. 3D are schematic flowcharts of fabricating a conductive column structure and a channel column structure of a memory device according to an embodiment of the invention.

Referring to FIG. 3A, formation of the channel column structure 114 is first described. In an embodiment, a columnar recess extending to the substrate 100 is formed in the dielectric layer 106. In an embodiment, a charge storage layer 112 is formed on a side wall of the columnar recesses through deposition of an initial charge storage layer and etching back. A silicon column 110 is then formed on the charge storage layer 112 through deposition of an initial polysilicon layer and etching back. In an embodiment, the initial polysilicon layer has a relatively small thickness and is insufficient to completely fill a recess, and therefore the silicon column 110 is hollow. In an embodiment, a central column 108 may be filled in the columnar recesses during subsequent formation of a dielectric layer 120. In another embodiment, the initial polysilicon layer may completely fill the recess. In this way, a solid silicon column 110 is formed through grinding of the polysilicon layer, and includes a polysilicon central column 108. The invention is not limited to the particular manner in which the channel column structure 114 is formed.

Thereafter, another dielectric layer 120 is formed on the dielectric layer 106. A thickness of the dielectric layer 120 is determined based on an estimated height of the conductive column structure 204. A large-depth recess 130 is formed in the two dielectric layers 106 and 120 using lithography and etching processes. The recess 130 reaches a corresponding one of the conductive layers 104 in depth, but does not contact with other conductive layers 104.

Figure 3B:
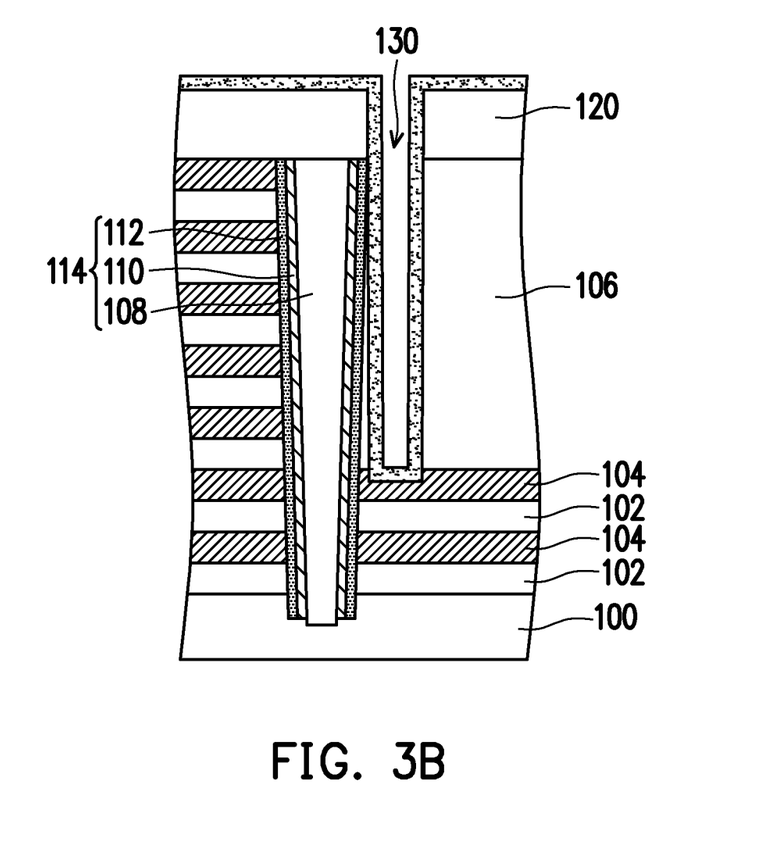
Figure 3C:
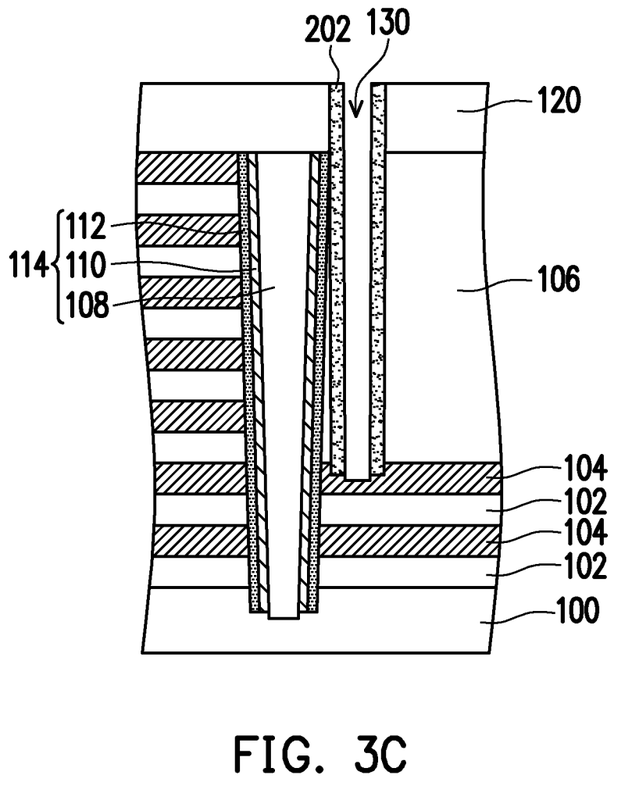

Referring to FIG. 3B, an initial liner insulating layer 122 is conformally deposited on a surface of the recess 130. Referring to FIG. 3C, the liner insulating layer 122 is etched back, and a remaining portion of the liner insulating layer 122 is a liner insulating layer 202 formed on a side wall of the recess 130.

Figure 3D:
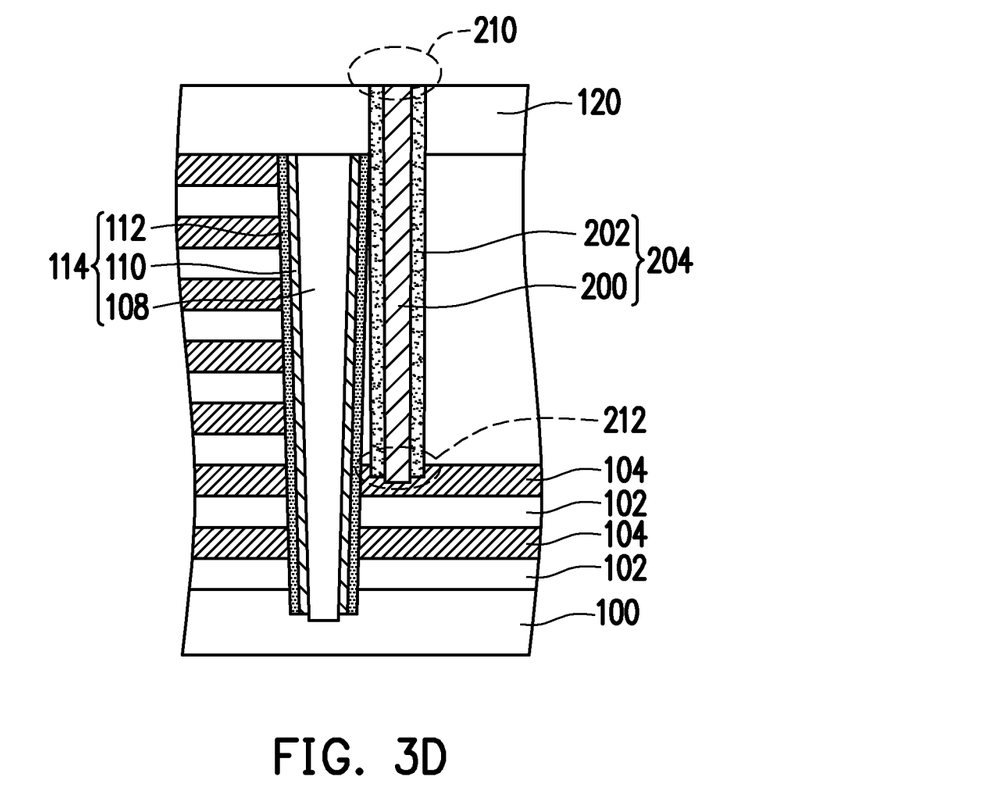

Referring to FIG. 3D, a conductive central column 200 is then filled in the recess 130 to form a conductive column structure 204. In the invention, not only a width of the conductive column structure 204 is maintained, but also isolation of the conductive central column 200 may be enhanced using the further formed liner insulating layer 202. In other words, although the dielectric layers 106 and 120 provide isolation, the liner insulating layer 202 is further formed in the invention to enhance the isolation effect.

Based on the formed liner insulating layer 202, a required structure is formed at an upper end portion 210 and a lower end portion 212 of the conductive central column 200.

Figure 4:
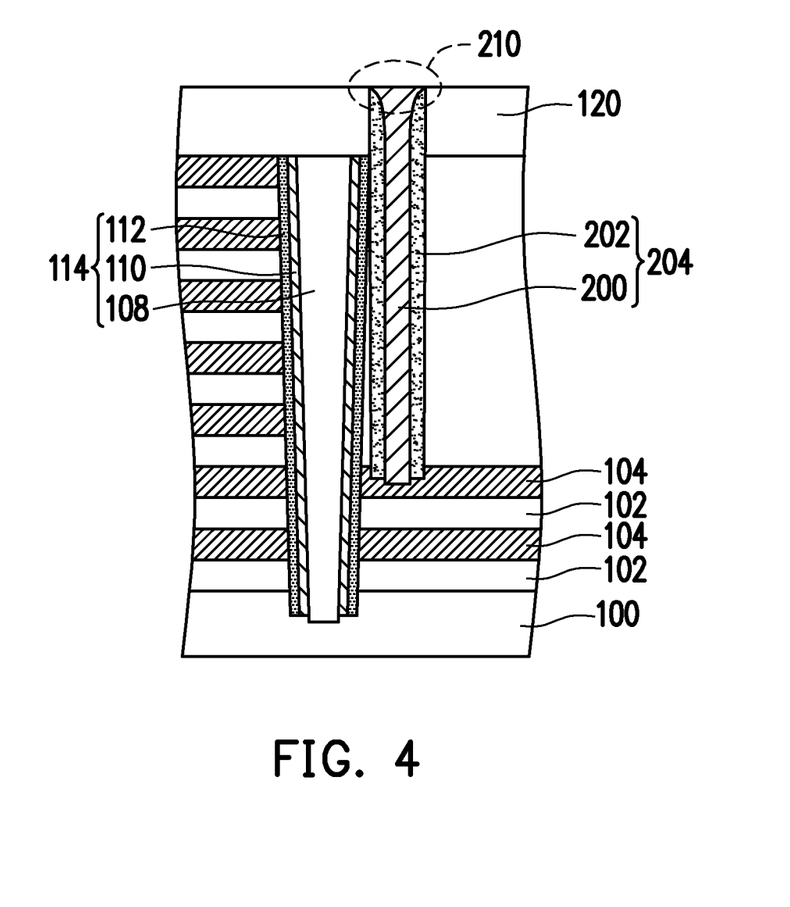
FIG. 4 is a schematic diagram of cross-sectional structures of a conductive column structure and a channel column structure according to an embodiment of the invention.

FIG. 4 is a schematic diagram of cross-sectional structures of a conductive column structure and a channel column structure according to an embodiment of the invention. Referring to FIG. 4, as carefully observed, at the upper end portion 210 of the conductive central column 200, there is a structure extending in a lateral direction. This is because etching back of the liner insulating layer 122 in FIG. 3C results in a skewed-face structure on a top of the liner insulating layer 202. Extended space of the structure is filled by the conductive central column 200.

Figure 5:
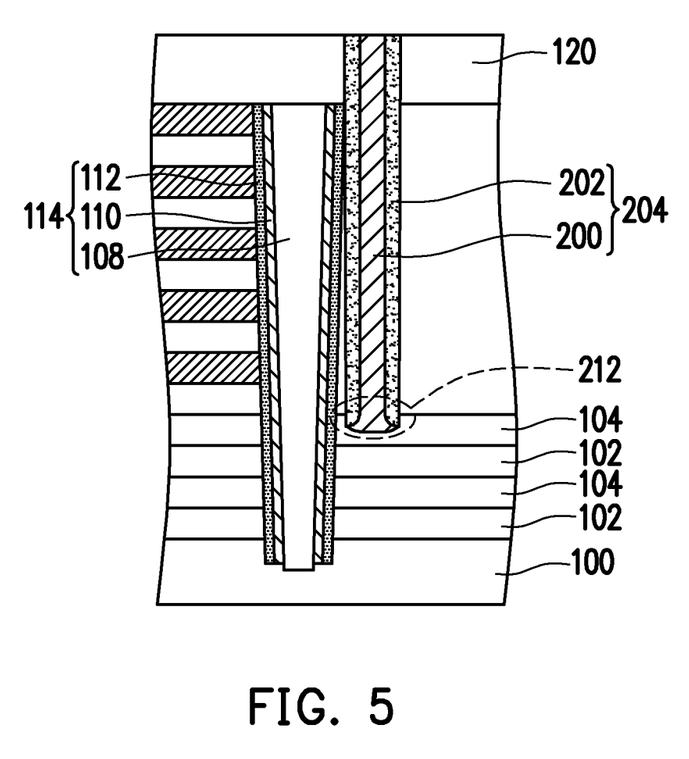
FIG. 5 is a schematic diagram of cross-sectional structures of a conductive column structure and a channel column structure according to an embodiment of the invention.

FIG. 5 is a schematic diagram of cross-sectional structures of a conductive column structure and a channel column structure according to an embodiment of the invention. Referring to FIG. 5, as carefully observed, at the lower end portion 212 of the conductive central column 200, a bottom of the conductive central column 200 includes a portion extending in a lateral direction. This is because an exposed surface of the conductive layer 104 is cleaned after the liner insulating layer 122 in FIG. 3C is etched back, for example, is cleaned using dilute hydrofluoric acid, and a bottom of the recess 130 is slightly etched in the cleaning process, causing a bottom face to extend laterally. The extended space is also filled by the conductive central column 200.

The liner insulating layer 202 further formed in the invention brings corresponding structures at the upper end portion 210 and the lower end portion 212 of the conductive central column 200. The conductive column structure 204 of the invention includes the liner insulating layer 202, so that the isolation effect of the conductive central column 200 may be enhanced.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A method for fabricating a memory device, comprising:
providing a substrate;
forming a plurality of conductive layers and a plurality of dielectric layers alternately and horizontally disposed on the substrate;
forming a first dielectric layer over the substrate and on at least one of the plurality of conductive layers;
forming, a channel column structure on the substrate and in the plurality of conductive layers and the plurality of dielectric layers, wherein a side wall of the channel column structure is in contact with the plurality of conductive layers; forming a second dielectric layer covering the first dielectric layer directly; and
forming, in the first and second dielectric layers, a conductive column structure adjacent to the channel column structure, wherein the conductive column structure comprises a liner insulating layer as a shell layer, and the conductive column structure is in direct contact with predetermined one of the plurality of conductive layers, and the liner insulating layer of the conductive column structure is in physically direct contact with the channel column structure;
wherein the step of forming the conductive column structure comprises:
forming, in the first and second dielectric layers, a columnar recess extending to the predetermined one of the plurality of conductive layers;
forming the liner insulating layer on a side wall of the columnar recess; and
filling the columnar recess with a conductive material to form a conductive central column in contact with the predetermined one of the plurality of conductive layers, wherein the liner insulating layer covers the conductive material and also isolates the conductive material from the channel column structure.

2. The method for fabricating the memory device according to claim 1, wherein the step of forming the channel column structure comprises:
forming, in the first dielectric layer, a columnar recess passing through the plurality of conductive layers;
forming, on a side wall of the columnar recess, a charge storage layer in contact with the plurality of conductive layers; and
forming, on the charge storage layer, a silicon column to be filled in the columnar recess, wherein the silicon column provides a channel area at each of the conductive layers correspondingly.

3. The method for fabricating the memory device according to claim 2, wherein the charge storage layer is an oxide/nitride/oxide-laminated structure.

4. The method for fabricating the memory device according to claim 1, wherein the conductive material comprises tungsten, copper, cobalt, silicon, or polysilicon.

5. The method for fabricating the memory device according to claim 1, wherein the liner insulating layer is made of a material comprising silicon oxide, a high-density plasma (HDP) dielectric, tetraethoxysilane (TEOS), thermal oxide, or a high dielectric constant dielectric.

6. The method for fabricating the memory device according to claim 1, wherein an upper end of the liner insulating layer comprises a skewed-face structure generated after the liner insulating layer is etched back.

7. The method for fabricating the memory device according to claim 1, wherein a bottom face of the conductive central column comprises a portion that protrudes in a lateral direction and that occupies a removed space generated through surface cleaning before the conductive material is filled.

8. The method for fabricating the memory device according to claim 1, wherein the conductive column structure is higher than the channel column structure.

9. The method for fabricating the memory device according to claim 1, wherein a length of the conductive column structure is greater than or equal to three micrometers.

* * * * *